(12) United States Patent
Yoshioka

(10) Patent No.: US 6,927,587 B2
(45) Date of Patent: Aug. 9, 2005

(54) PROBE APPARATUS

(75) Inventor: Haruhiko Yoshioka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/642,751

(22) Filed: Aug. 19, 2003

(65) Prior Publication Data

US 2004/0036861 A1 Feb. 26, 2004

(30) Foreign Application Priority Data

Aug. 23, 2002 (JP) ....................................... 2002-243785

(51) Int. Cl.$^7$ ............................................ G01R 31/02
(52) U.S. Cl. ...................... 324/754; 324/751; 324/758
(58) Field of Search ................ 324/754–765, 324/158.1

(56) References Cited

U.S. PATENT DOCUMENTS

| | | | | |
|---|---|---|---|---|
| 5,550,480 A | * | 8/1996 | Nelson et al. | .............. 324/754 |
| 6,140,828 A | * | 10/2000 | Iino et al. | .................... 324/758 |
| 6,809,536 B2 | * | 10/2004 | Suzuki | ........................ 324/754 |
| 2002/0011854 A1 | * | 1/2002 | Kuji et al. | ................... 324/754 |
| 2002/0024354 A1 | * | 2/2002 | Pietzschmann | ............. 324/765 |

* cited by examiner

*Primary Examiner*—Vinh Nguyen
*Assistant Examiner*—Emily Y Chan
(74) *Attorney, Agent, or Firm*—Oblon, Spivak, McClelland, Maier & Neustadt, P.C.

(57) ABSTRACT

A probe apparatus includes a mounting member on which an object to be inspected is mounted and a temperature thereof is being adjusted, a probe card arranged opposite to the mounting member, a driving mechanism which changes a relative positional relationship between the mounting member and the probe card, and a sensor which detects the distance between the sensor and the probe card. By way of detecting the height of the deformed probe card through the use of the sensor and revising the elevation distance of the mounting member, the electrode pads of the wafer W and the probe pins can electrically contact each other with a stable pin pressure, providing high inspection reliability and an increase in throughput.

13 Claims, 5 Drawing Sheets

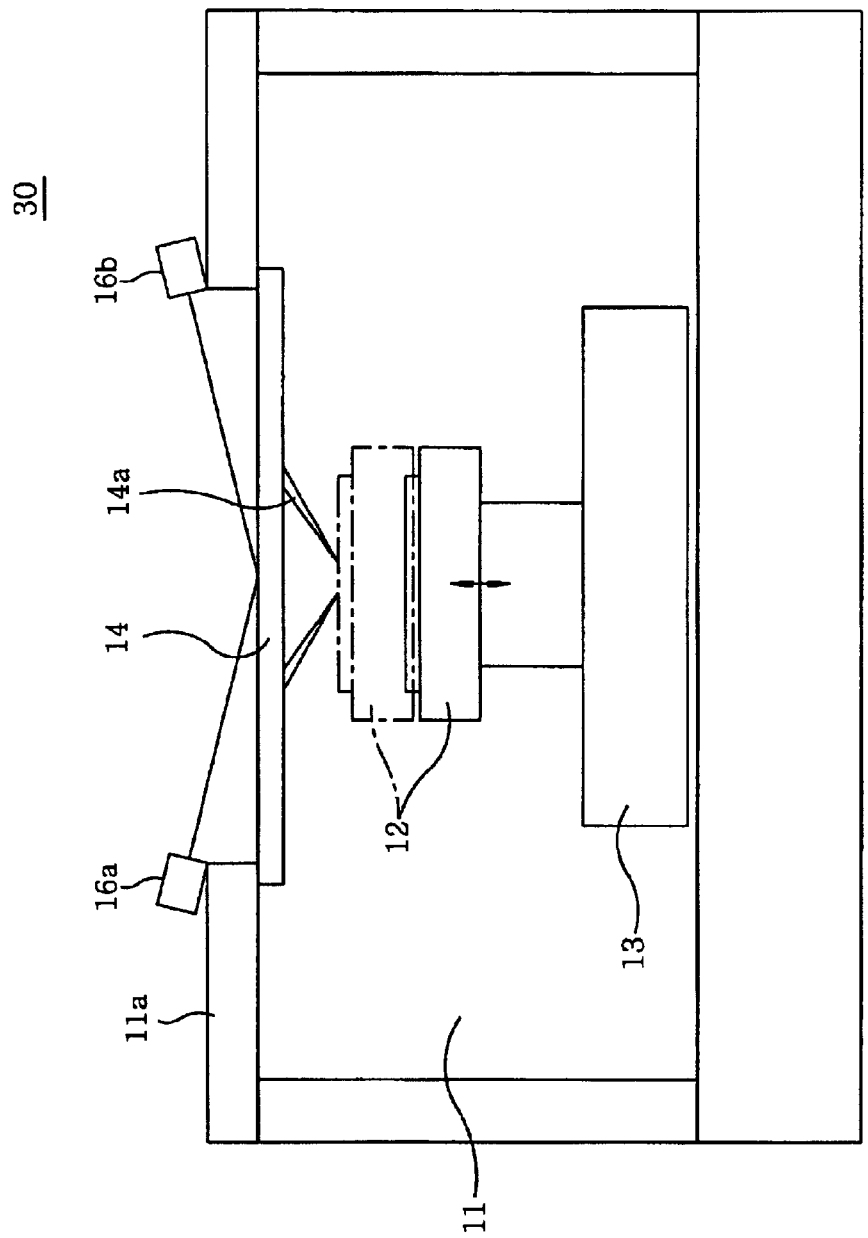

PROBE APPARATUS

FIELD OF THE INVENTION

The present invention relates to a probe apparatus; and, more particularly, to a probe apparatus capable of providing an enhanced inspection reliability.

BACKGROUND OF THE INVENTION

FIGS. 5A and 5B illustrate a conventional probe apparatus used for inspecting electrical characteristics of, e.g., devices formed on a wafer during the manufacture of the devices. As shown in FIGS. 5A and 5B, the probe apparatus includes a loader chamber 1 for loading a wafer W and a prober chamber 2 for inspecting electrical characteristics of the wafer W conveyed from the loader chamber 1. The loader chamber 1 includes a cassette table 3, a wafer convey mechanism 4 for conveying the wafer W to the prober chamber 2, and a sub-chuck 5 for pre-aligning the wafer W with reference to an orientation flat or a notch thereof during the process of conveying the wafer W via the wafer convey mechanism 4.

Further, the prober chamber 2 includes a temperature controllable main chuck 6 on which the pre-aligned wafer W provided by the wafer convey mechanism 4 is mounted; an XY table 7 which moves the main chuck 6 in X and Y directions; a probe card 8 arranged above the main chuck 6; and a position alignment mechanism 9 which enables a plurality of probe pins 8a of the probe card 8 to be precisely aligned to a plurality of electrode pads (not shown) of the wafer W mounted on the main chuck 6. The alignment mechanism 9 includes an upper camera 9b attached to an alignment bridge 9a to monitor the wafer W and a lower camera 9c attached to the main chuck 6 to monitor the probe pins 8a. The alignment bridge 9a aligns the electrode pads of the wafer W and the probe pins 8a by way of advancing from one end of the prober chamber 2 to a probe center along a pair of guide rails 9d.

Furthermore, as shown in FIG. 5A, a test head T of a tester is movably disposed on a head plate 2a of the prober chamber 2 and is electrically connected with the probe card 8 via a performance board (not shown). With the temperature of the wafer W on the main chuck 6 being set at a temperature ranging from −20° C. to +150° C., inspection signals are sent from the tester via the test head T and the performance board to the probe pins 8a. The electrical characteristics of a multiplicity of semiconductor elements (devices) formed on the wafer W are inspected by applying the inspection signals from the probe pins 8a to the electrode pads of the wafer W.

The inspection of the wafer includes a high temperature inspection and a low temperature inspection. During the high temperature inspection process, the wafer is inspected after being heated up to a predetermined temperature (e.g., at 100° C. or higher) by a temperature control mechanism embedded in the main chuck 6. The low temperature inspection process is carried out after cooling the wafer down to a predetermined temperature (e.g., at 0° C. or lower) by the temperature control mechanism.

In the high temperature inspection process, however, since the wafer is inspected at a high temperature at 100° C. or higher, the probe card 8 is heated by the main chuck 6 and therefore, may be bent by thermal deformation. As a result, the Z directional distance (Z vertical distance) between the probe pins 8a and the electrode pads of the wafer W can be varied by, e.g., 100 μm, causing poor contacts between the probe pins 8a and the electrode pads of the wafer W and decreasing inspection reliability. Therefore, the main chuck 6 is heated before the inspection and the probe card 8 is preheated by placing the main chuck 6 in proximity to the probe card 8. The wafer is then put into a pseudo-contact state by considering the thermal deformation of the probe card 8 and the actual inspection is performed so that the poor contact problems between the probe pins 8a and the electrode pads can be ameliorated.

However, even in such a case where the probe card 8 is preheated and the wafer W is put into the pseudo-contact state prior to the actual inspection stage, the Z directional displacement of the probe card 8 due to a thermal deformation caused by additional heating during the actual inspection stage and that due to a contact load urged thereto during the inspection stage cannot be properly estimated. Accordingly, an excess or deficiency may occur in the contact load between the probe pins 8a and the electrode pads of the wafer W, to thereby lower the inspection reliability. Furthermore, a considerable amount of time (e.g., 1~2 hours) may be required for the probe card 8 to become thermally stable, leading to a significant decrease in throughput.

SUMMARY OF THE INVENTION

It is, therefore, an object of the present invention to provide a probe apparatus capable of performing the inspection with improved reliability and increased throughput by way of detecting the Z directional displacement of the probe card during the inspection stage and stabilizing the contact load between the probe pins and the objects to be inspected.

In accordance with the present invention, there is provided a probe apparatus including a mounting member on which an object to be inspected is mounted, a temperature of the object being adjusted by the mounting member; a probe card arranged opposite to the mounting member; a driving mechanism which changes a relative positional relationship between the mounting member and the probe card; and a sensor which detects the distance between the sensor and the probe card.

BRIEF DESCRIPTION OF THE DRAWINGS

The above and other objects and features of the present invention will become apparent from the following description of preferred embodiments given in conjunction with the accompanying drawings, in which:

FIG. 4 depicts a schematic cross sectional view of a main portion of a probe apparatus in accordance with a third preferred embodiment of the present invention;

DETAILED DESCRIPTION OF THE PREFERRED EMBODIMENTS

Figure 1:
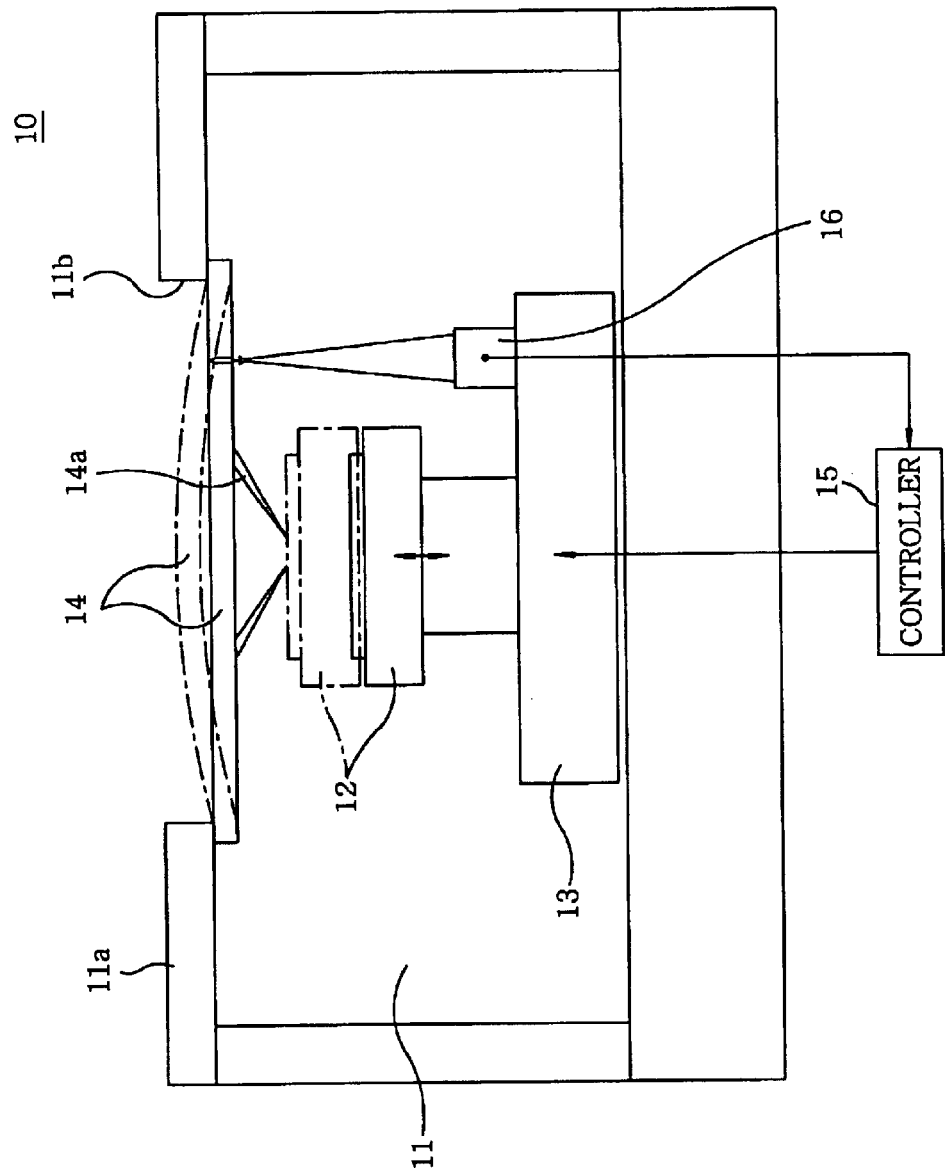
FIG. 1 is a schematic cross sectional view of a main portion of a probe apparatus in accordance with a first preferred embodiment of the present invention.

Preferred embodiments of the present invention will now be described in detail with reference to FIGS. 1 to 4, in which like parts are denoted by like reference numerals.

Figure 5A:
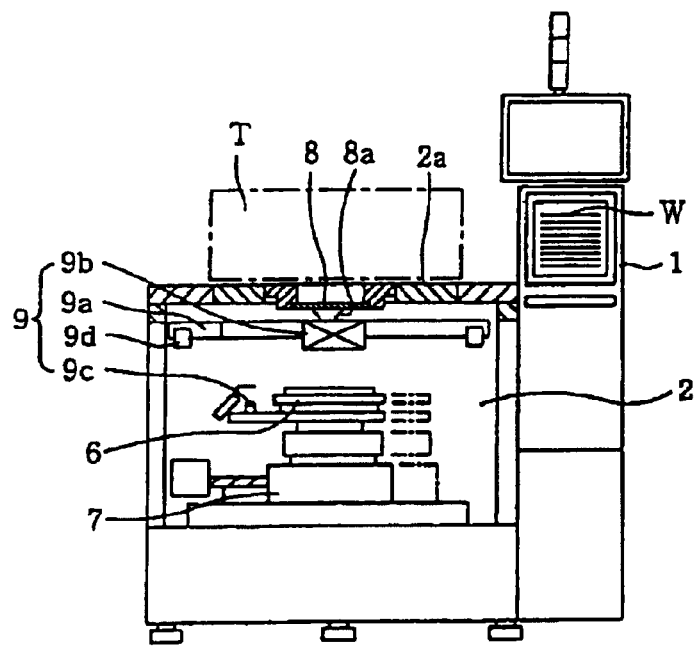
FIG. 5A offers a front cross sectional view of a prober chamber of a conventional probe apparatus.
Figure 5B:
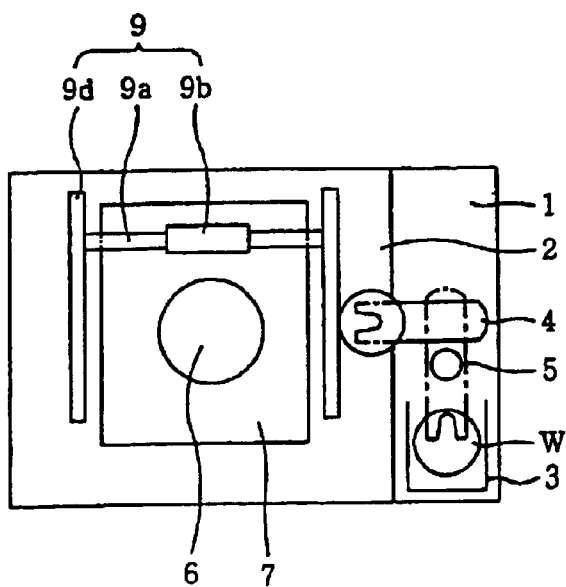
FIG. 5B presents a plane view showing the interior of the conventional probe apparatus shown in FIG. 5A.

As shown in FIG. 1, a probe apparatus 10 of a first preferred embodiment includes, as in the conventional one shown in FIGS. 5A and 5B, a main chuck 12 which is situated inside a prober chamber 11 and is vertically moved in a Z direction by an elevating mechanism (not shown) embedded therein; an XY table 13 which moves the main chuck 12 in X and Y directions; a probe card 14 which is arranged above the main chuck 12; an alignment mechanism (not shown) which aligns the probe card 14 with a wafer W mounted on the main chuck 12; and a controller 15 which controls driving mechanisms thereof. The probe card 14 is fixed at an opening 11b of a head plate 11a of the prober chamber 11.

When the wafer W is inspected, the alignment mechanism and the XY table 13 cooperate to align the wafer W mounted on the main chuck 12 to the probe pins 14a of the probe card 14. Afterwards, the wafer W is moved by the XY table 13 and elevated in the Z direction by the main chuck 12. When the electrode pads of the wafer W electrically contact the probe pins 14a, the inspection of electrical characteristics of the wafer W is carried out.

On the XY table 13 is installed a laser displacement sensor 16, which emits a laser beam to the probe card 14 to detect the height thereof (i.e., the distance between the laser displacement sensor 16 and the probe card 14). The laser displacement sensor 16 detects the height of the probe card 14 each time the XY table 13 moves, consequently detecting heights throughout the whole surface of the probe card 14. The laser displacement sensor 16 is connected to the controller 15 and operated under its control. The detected heights are stored in the controller 15.

Figure 2:
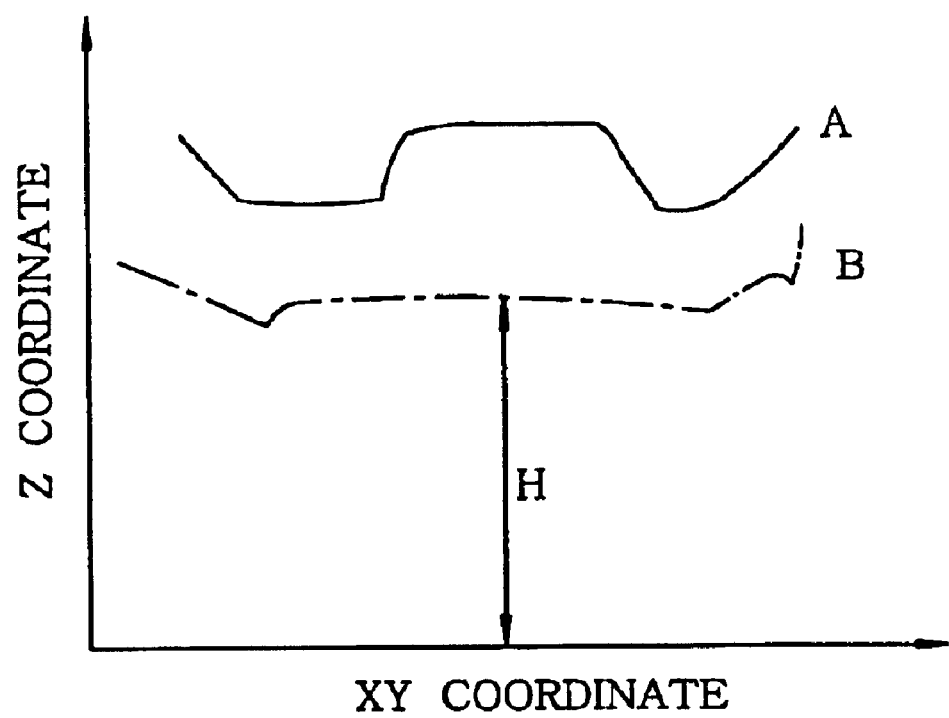
FIG. 2 shows graphs showing heights of a probe card detected by a laser displacement sensor illustrated in FIG. 1.

In accordance with the present invention, e.g., at room temperature where the probe card 14 is not thermally deformed, the main chuck 12 is moved by the XY table 13 within the inspection range of wafer W, and the height of the probe card 14 is detected as Z coordinate by the laser displacement sensor 16 every time a movement is made. Then the Z coordinate data, and their corresponding X, Y coordinate data of the laser displacement sensor 16 are stored in the controller 15 as reference heights. A dashed dotted line "B" in FIG. 2 shows a graph of reference heights representing the relationship between the XY coordinates and the Z coordinate at room temperature. Referring to the reference height, the controller 15 obtains the height displacement of the probe card 14 caused by thermal deformation during the high temperature inspection stage.

When the wafer W is inspected at a high temperature of, e.g., 100° C., the wafer W mounted on the main chuck 12 is heated to 100° C. and moved by the XY table 13, during which the height of the probe card 14 is detected by the laser displacement sensor 16 every time a movement is made. The detected height is compared with the reference height at the same XY coordinates. If the two heights are identical, the probe card 14 is considered not to have been thermally deformed.

Since, however, the probe card 14 is deformed by thermal expansion during the high temperature inspection process, the detected height will not be identical with the reference height. The controller 15 obtains the ratio of the detected height to the reference height and, based thereon, revises the elevation distance of the main chuck 12 in order to stabilize the electrical contacts between the electrode pads of the wafer W and the probe pins 14a with a constant pin pressure. Accordingly, the inspection of electrical characteristics can be performed with high reliability.

The operation of the probe apparatus 10 will now be described in detail. While the main chuck 12 is heated under the control of the controller 15, the wafer W is conveyed from a loader chamber to the main chuck 12 in the prober chamber 11 via a convey mechanism (not shown). And then, under the control of the controller 15, the alignment mechanism and the XY table 13 cooperate to align the electrode pads of the wafer W mounted on the main chuck 12 to the probe pins 14a of the probe card 14.

Subsequently, the main chuck 12 arrives at an initial position of inspection and the laser displacement sensor 16 detects the height of the heated probe card 14 thereat. At this time, the probe card 14 is not required to be thermally stable. When the height of the heated probe card 14 detected at the position of the laser displacement sensor 16 is denoted by "b" and the height of the probe card 14 at room temperature detected at the same position is denoted by "a", the location, e.g., the center, of the probe card 14 at which the probe pins 14a reside is assumed to be deformed by the ratio "b/a". Accordingly, when the reference height at the center of the probe card 14 at room temperature is "H", the height of the deformed center of the probe card 14 is estimated to be "H×(b/a)". When the main chuck 12 is elevated by a revised height obtained based on the above estimated height and then overdriven, the electrode pads of the wafer W and the probe pins 14a electrically contact each other with a predetermined pin pressure to perform the inspection of electrical characteristics of a device.

After the inspection, the main chuck 12 is lowered and the wafer W is moved to a next device position by the XY table 13. Then, in the same way described above, the elevation distance of the main chuck 12 is revised based on the height detected by the laser displacement sensor 16, making it possible to inspect the electrical characteristics of the wafer W repeatedly with a stable pin pressure. Therefore, even in the case where an organic insulating film exists below the electrode pads, the inspection can be performed with high reliability without damaging the insulating film. The height of the probe card 14 during the inspection can be stored sequentially in the controller 15, and the height variation is shown in FIG. 2 by a solid line "A".

Alternately, instead of indirectly estimating a displacement of the probe pins 14a based on the reference height "a" and the measured height "b" that are obtained at a position of the probe card 14 directly above the laser displacement sensor 16, the displacement of the region of the probe card 14 at which the probe pins 14a are disposed (which shall be called the "probe region" hereinafter) can be directly measured by moving the laser displacement sensor 16 directly underneath the probe region and measuring the height "h" thereat just prior to adjusting the elevation distance of the main chuck 12 for each inspection of electrical characteristics of a device. In this case, such reference height data as shown in FIG. 2 is not required since the displacement measurement is carried out only at one center point of the probe card 14 where the probe pins 14a are located and the actual inspection is carried out.

As described above, the first preferred embodiment employs the laser displacement sensor 16 installed on the XY table 13 to detect the height of the probe card 14 thereby. Accordingly, even if the probe card 14 thermally expands and deforms on account of heat emission from the main chuck 12 during the high temperature inspection of the wafer W as shown by the dashed dotted line in FIG. 1, by way of detecting the height of the deformed probe card 14 through the use of the laser displacement sensor 16 and revising the elevation distance of the main chuck 12, the electrode pads of the wafer W and the probe pins 14a can electrically contact each other with a stable pin pressure, providing high inspection reliability. Moreover, the inspection is not required to be postponed until the probe card 14 is thermally stabilized, which leads to an increase in throughput.

Figure 3:
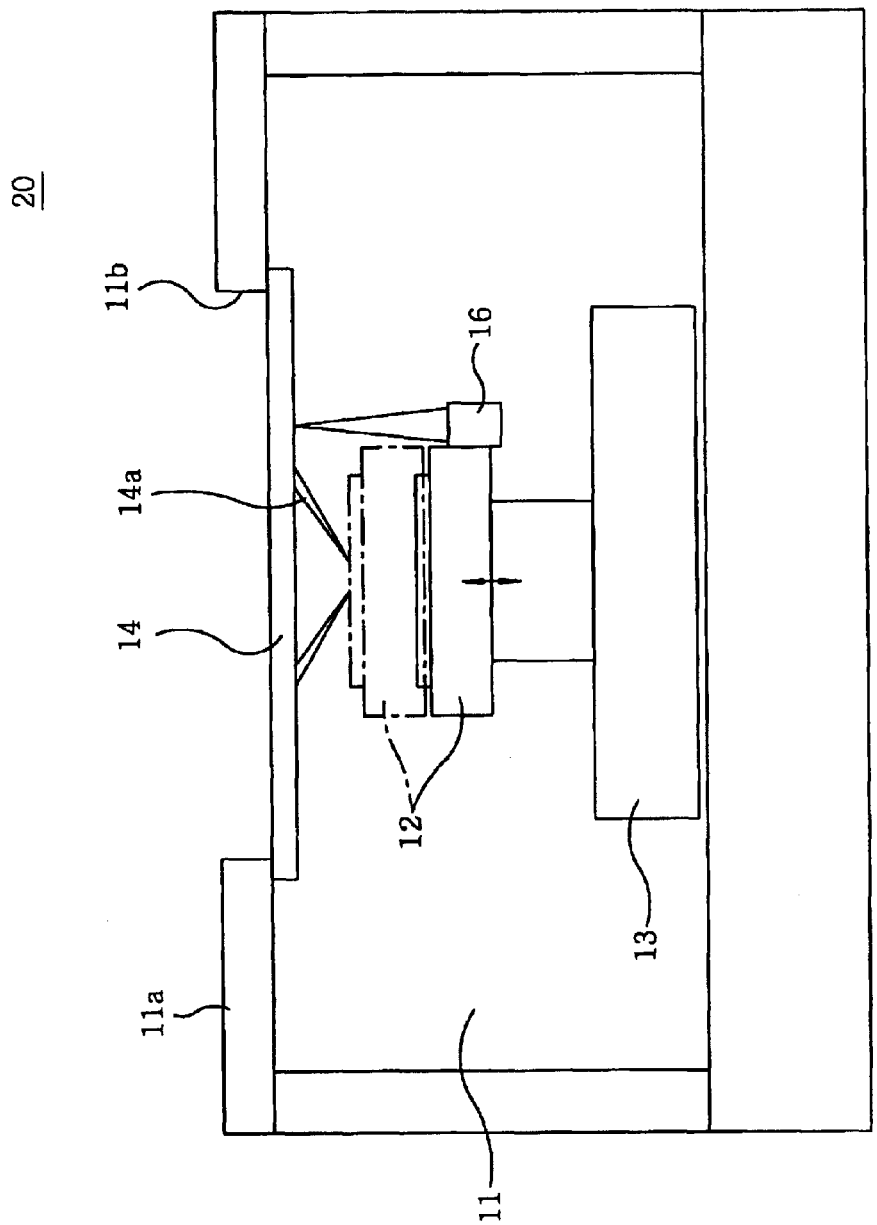
FIG. 3 schematically illustrates a cross sectional view of a main portion of a probe apparatus in accordance with a second preferred embodiment of the present invention.

FIG. 3 shows a probe apparatus 20 in accordance with a second preferred embodiment of the present invention. In FIG. 3, a controller is omitted. The probe apparatus 20 is identical to that of the first preferred embodiment, excepting that the laser displacement sensor 16 is attached to the main chuck 12. Therefore, even if the main chuck 12 is pushed down and/or slanted by the contact pressure applied to the main chuck 12 while inspecting a device disposed at a peripheral region of the wafer W, such displacement of the main chuck 12, along with the thermal deformation of the probe card 14, can be detected as an overall displacement of the probe card 14 by the laser displacement sensor 16. And since the elevation distance is corrected or adjusted based on the displacement thus detected, the pin pressure between the electrode pads of the wafer W and the probe pins 14a can be more stable, leading to high inspection reliability.

FIG. 4 shows a probe apparatus 30 in accordance with a third preferred embodiment of the present invention. In FIG. 4, a controller is omitted for the sake of simplicity. The probe apparatus 30 is identical to the first and the second preferred embodiments, excepting that the laser displacement sensor 16 (16a, 16b) is attached to the head plate 11a. Since the third preferred embodiment has the laser displacement sensor 16 attached to the head plate 11a, the Z directional displacement of the probe card 14 can be detected from the upper side thereof and the pin pressure between the electrode pads of the wafer W and the probe pins 14a can be stabilized, rendering high inspection reliability.

In this preferred embodiment, the laser displacement sensor 16 is comprised of two separate members 16a and 16b because the laser beam is illuminated at an oblique angle to the upper surface of the probe card 14. As will be readily appreciated by those skilled in the art, one of those sensors 16a, 16b would be a laser beam generating device and the other one would be a photo sensor receiving a laser beam reflected by the upper surface of the probe card 14. In the previous embodiments, the two members are incorporated into a single body of the laser displacement sensor 16 since the laser beam is emitted onto the lower surface of the probe card 14 at a substantially perpendicular angle. Also, in the third embodiment, the actual real-time vertical displacement of the probe card 14 can be directly measured by detecting the Z directional displacement of the backside of the region where the probe pins 14a are located. Therefore, the inspection of the devices can be carried out with even more enhanced reliability. Further, in this embodiment, such reference height data for the whole XY range as shown in FIG. 2 is not required since the displacement measurement is carried out only at one center point of the probe card 14 where the probe pins 14a are located and the actual inspection is carried out.

In the above-described preferred embodiments, the description is made for the case in which the probe card 14 is arranged above the main chuck 12. However, their positional relationship can be arranged alternatively. That is, the main chuck 12 can be placed above the probe card 14. And also, the main chuck 12 and the probe card 14 can be disposed in a side by side arrangement.

Further, in the above preferred embodiments, the relative positional relationship between the main chuck 12 and the probe card 14 is changed by moving the main chuck 12 in the X, Y and Z directions through the use of the XY table 13 and the elevating mechanism embedded therein. The relationship, however, may be changed by moving the probe card 14 in the X, Y and Z directions with the main chuck 12 being fixed. Alternately, for instance, the main chuck 12 can be made to move in the X and Y directions while the probe card 14 moves in the Z direction, or vice versa.

Still further, it is to be appreciated that other types of displacement sensors, e.g., a capacitive sensor, can be used in lieu of the laser displacement sensor.

While the invention has been shown and described with respect to the preferred embodiments, it will be understood by those skilled in the art that various changes and modifications may be made without departing from the spirit and scope of the invention as defined in the following claims.

What is claimed is:

1. A probe apparatus comprising:
   a mounting member on which an object to be inspected is mounted, the mounting member configured to adjust a temperature of the object;
   a probe card arranged opposite the mounting member;
   a driving mechanism configured to change a relative positional relationship between the mounting member and the probe card; and
   sensor means detecting a displacement of the probe card at a center of the probe card, the sensor means provided at a part of the apparatus to which the probe card is fixed.

2. The probe apparatus of claim 1, wherein the sensor means is a laser displacement sensor or a capacitive sensor.

3. The probe apparatus of claim 1, wherein the driving mechanism moves the mounting member in X, Y and Z directions.

4. A probe apparatus comprising:
   a mounting member for mounting thereon an object to be inspected;
   a probe card provided with a plurality of probe pins;
   a driving mechanism configured to change a relative positional relationship between the mounting member and the probe card; and
   a sensor unit, provided at a part of the apparatus to which the probe card is fixed, configured to detect a displacement of a region of the probe card where the probe pins are located.

5. The probe apparatus of claim 4, wherein the probe card includes a main surface where the probe pins are provided and a back surface opposite the main surface, and the sensor unit is configured to detect the displacement from a measuring point at the back surface.

6. The probe apparatus of claim 5, wherein the measuring point corresponds to a center of the probe pins.

7. The probe apparatus of claim 4, wherein the sensor unit includes a laser beam generating device and a photo sensor fixedly mounted to the part of the apparatus, the photo sensor provided across the probe card from the laser beam generating device.

8. The probe apparatus of claim 4, further comprising a fixed top plate located at an upper part of the probe apparatus, the probe card and the sensor unit fixedly mounted to the top plate.

9. The probe apparatus of claim 8, wherein the driving mechanism is configured to move the mounting member in X, Y and Z directions.

10. The probe apparatus of claim 8, wherein the probe card and the sensor unit are placed at bottom and top surfaces of the top plate, respectively, and the mounting member is disposed below the probe card.

11. A probe apparatus comprising:

a mounting member for mounting thereon an object to be inspected;

a probe card provided with a plurality of probe pins;

a driving mechanism configured to change a relative positional relationship between the mounting member and the probe card; and means for detecting a displacement of a region of the probe card where the probe pins are located with respect to the position of a part of the apparatus, the detecting means provided at a part of the apparatus to which the probe card is fixed.

12. The probe apparatus of claim 11, wherein the probe card includes a main surface where the probe pins are provided and a back surface opposing the main surface, and the means for detecting detects the displacement from a measuring point at the back surface.

13. The probe apparatus of claim 12, wherein the measuring point corresponds to a center of the probe pins.

* * * * *